United States Patent [19]

Kazmierowicz

[11] 4,148,761

[45] * Apr. 10, 1979

[54] CONDUCTOR COMPOSITIONS COMPRISING ALUMINUM, SILICON AND GLASS

[75] Inventor: Casimir W. Kazmierowicz, Mission Viejo, Calif.

[73] Assignee: Beckman Instruments, Inc., Fullerton, Calif.

[*] Notice: The portion of the term of this patent subsequent to Jan. 24, 1995, has been disclaimed.

[21] Appl. No.: 764,093

[22] Filed: Jan. 31, 1977

[51] Int. Cl.² .................... H01B 1/08; B32B 15/00
[52] U.S. Cl. ............................ 252/512; 106/47 R; 106/49; 106/73.4; 204/292; 204/293; 252/62.2; 252/500; 252/518; 428/195; 428/432; 428/457; 428/469; 428/426; 428/539
[58] Field of Search ............. 106/335, 47 R, 49, 73.4; 204/292; 252/500, 518, 62.2, 512; 428/208, 206, 325, 328, 331, 195; 338/308

[56] References Cited

U.S. PATENT DOCUMENTS

| | | | |
|---|---|---|---|
| 3,484,284 | 12/1969 | Dates et al. | 106/49 |
| 4,000,026 | 12/1976 | Rexer | 252/512 X |
| 4,039,721 | 8/1977 | Weitze et al. | 252/512 X |
| 4,044,173 | 8/1977 | Laurie | 252/518 X |

OTHER PUBLICATIONS

Hackh's Chemical Dictionary, McGraw-Hill Co., 1969, p. 604.

*Primary Examiner*—George F. Lesmes
*Assistant Examiner*—R. Eugene Varndell, Jr.
*Attorney, Agent, or Firm*—R. J. Steinmeyer; F. L. Mehlhoff; R. S. Frieman

[57] ABSTRACT

Powder compositions useful for making conductors, e.g. microcircuit conductors, end terminations for capacitors, electrodes for gas discharge display devices, etc. The compositions comprise inorganic powders dispersed in an inert vehicle and are printed and fired in the conventional manner on dielectric substrates. The inorganic powders comprise aluminum, silicon, and glass.

5 Claims, No Drawings

CONDUCTOR COMPOSITIONS COMPRISING ALUMINUM, SILICON AND GLASS

BACKGROUND OF THE INVENTION

1. Field of the Invention

This invention relates to cermet conductor films and more particularly to compositions useful for producing conductive patterns adherent to substrates.

2. Description of the Prior Art

Increased use of glass sheet as a substrate for printed circuitry and gas discharge displays has impelled commercial development of compatible conductor metallizations. Traditional metallizations employing noble metals such as silver, gold, platinum, or palladium have been found to be poorly suited for use on glass substrates. For example, the firing temperature of these compositions is generally too high to be withstood by substrates constructed of soda lime glass. In addition, noble metal compositions are prone to sputtering and glow discharge and are among the costliest metals in common use. Other materials utilizing a base metal conducting phase such as nickel, as disclosed by Patterson in U.S. Pat. No. 3,943,168, overcome some of these deficiencies, but still suffer from certain drawbacks. They are, for example, still relatively expensive and they tend to suffer from poor moisture resistance (the latter being the result of a high $B_2O_3$ content).

Another shortcoming of nickel based compositions is evident where they are used to make gas discharge display devices. As is generally known, the operating characteristics of gas discharge displays are significantly improved when cathode surfaces are formed of high density nickel. Commercially available metallizing compositions contain frit glasses which have been incorporated to provide acceptable cohesive properties and to provide good adhesion to a substrate. However, this glass content at the same time makes it impossible for a film to possess the aforesaid desirable dense nickel surface. It is, therefore, a usual practice to plate cathode surfaces of gas discharge displays with nickel metal in order to obtain optimum operation. Unfortunately, the plating process frequently degrades the film's adhesion to the substrate.

Aluminum is another base metal which is much more inexpensive than nickel. (Aluminum costs approximately 4.7¢ per cubic inch versus nickel which costs approximately 65¢ per cubic inch.) However, aluminum yields relatively poor thick film patterns having relatively high resistivities because of, among other things, the extensive formation during firing of aluminum oxide. If one adds glass to finely divided aluminum, as taught in Dates et al. 's U.S. Pat. No. 3,484,284, one can lower the resistivity somewhat but one still obtains a thick film pattern having a relatively high resistivity. In addition, the aluminum-glass conductor composition possesses a resistivity which is very sensitive to firing temperatures, i.e., has a very narrow firing range (firing window) wherein one can obtain conductor compositions possessing a desirable resistivity.

Because of the low cost of aluminum it would be very advantageous if one could further lower the resistivity of aluminum based conductor compositions as well as broaden the firing window of said compositions. One avenue of research that those skilled in the art would immediately reject is the addition to aluminum based compositions of alloying metals having a higher resistivity than the resistivity of aluminum. As those skilled in the art know, the alloying of two metals usually results in an alloy which possesses a resistivity at least greater than the resistivity of the more conductive component and often greater than the resistivity of the less conductive component as well.

SUMMARY OF THE INVENTION

This invention provides aluminum-silicon-glass compositions used for producing conductor patterns on dielectric substrates. The compositions can, but need not be, fired in air. Moreover, they can be fired even at a temperature compatible with the use of inexpensive soda lime glass substrates. The compositions nevertheless can produce conductor patterns having useful resistivities and adhesion.

The compositions of this invention are finely divided inorganic powders dispersed in a liquid vehicle. The inorganic aluminum-silicon-glass powder compositions comprise a mixture of from about 0.25 to about 30 weight percent silicon metal, from about 10 to about 50 weight percent glass, and from about 20 to about 90 weight percent aluminum metal.

The instant invention also encompasses the composition of the present invention fired (sintered) on and adhered to a dielectric substrate, such as glass, glass-ceramic, and ceramic substrates. The present invention also involves improved gas discharge display devices. Such devices comprise two dielectric substrates having conductive patterns printed on one or both thereof in operative fashion. The substrates are assembled such that a dielectric spacer separates them and defines a cavity or gap between the substrates. The device is, of course, provided with means for holding the two substrates and separator together, e.g., clamps, adhesives, etc. The cavity is filled with an ionizable light-producing gas of the type well known to those skilled in the art (including argon, neon, or the like, separately or in mixture). In the use of such devices an electric field is applied as desired to various electrode segments, causing ionization and production of light. The improvement in the devices of the present invention lies in the use of electrodes of the sintered or fired compositions of the present invention, that is, the electrodes are produced by printing on the substrate a dispersion of one or more of the aluminum-silicon-glass compositions of the present invention.

DESCRIPTION OF THE PREFERRED EMBODIMENTS

The compositions of the present invention are finely divided powders dispersed in a liquid vehicle. The inorganic aluminum-silicon-glass powder compositions comprise a mixture of from about 0.25 to about 30 weight percent silicon, from about 10 to about 50 weight percent glass, and from about 20 to about 90 weight percent aluminum. In one preferred embodiment, the compositions of the present invention comprise from about 0.25 to about 1.5 weight percent silicon, from about 25 to about 35 weight percent glass, and from about 75 to about 87 weight percent aluminum. In a second preferred embodiment of the instant invention, the compositions comprise from about 7 to 11 weight percent silicon, from about 35 to about 45 weight percent glass, and from about 35 to about 58 weight percent aluminum.

The compositions of the present invention will normally be fired at temperatures in the range from about 580° to about 660° C., preferably from about 580° to about 625° C. Although air firing is most convenient, the compositions can also be fired in inert or reducing atmospheres. Normally the time of firing is at least two minutes, preferably about 10 minutes at peak temperature.

If one plans to refire the compositions of the instant invention, it is preferred to use a composition comprising from about 0.25 to about 1.5 weight percent silicon, from about 25 to about 35 weight percent glass, and from about 75 to about 87 weight percent aluminum.

The aluminum-silicon-glass compositions of the present invention can be made by simply mixing desired amounts of the appropriate components together.

Any conventional electronic glass powder can be used as the inorganic binder in the compositions of the present invention. Because it is desirable to fire the compositions of the instant invention at relatively low temperatures, high lead glasses are preferred for use as the glass frit component of the powder compositions of the present invention. The phase diagram depicting the preferred glass frits used in the present invention appears in R. F. Geller and E. R. Bunting, *J. Res. Natl. Bur. of Standards*, 23 (8):281 (1939); R. P. 1231, said diagram being incorporated herein in toto by reference.

All the inorganic powders used herein are finely divided, i.e., passed through a 400 mesh screen. It is preferred that the particles have an average particle size of 10 microns or less.

The inorganic particles are mixed with an inert liquid vehicle by mechanical mixing to form a paste-like composition. The latter is printed as "thick film" on conventional dielectric substrates in the conventional manner. Any inert liquid may be used as a vehicle. Any one of various organic liquids, with or without thickening and/or stabilizing agents and/or other common additives, can be used as the vehicle. Exemplary of the organic liquids which can be used are the aliphatic alcohols; esters of such alcohols, for example, the acetates of propionics; terpines such as pine oil, terpinol and the like; solutions of resins such as the polymethacrylates of lower alcohols, or solutions of ethyl cellulose, and solvents such as pine oil and monobutylether of ethylene glycol monoacetate. The vehicle may contain or be composed of volatile liquids to promote fast setting after application to the substrate.

In order to enhance the cohesive properties of the unfired paste, an organic binder can be included in the composition. During the subsequent firing, the binder is volatized and lost. Several conventional binding agents, particularly those of the cellulosic type, can be used to advantage.

The ratio of vehicle to solids in dispersions can vary considerably and depends on the manner in which the dispersion is to be applied and the kind of vehicle used. Normally to achieve good coverage the dispersion will contain from about 65 to about 85 weight percent solids and from about 15 to about 35 weight percent vehicle. The compositions of the present invention can, of course, be modified by the addition of other materials which do not affect its beneficial characteristics.

After drying to remove the vehicle, firing of the compositions of the present invention is carried out at temperatures and for times sufficient to sinter the inorganic materials and to produce conductor patterns adherent to the dielectric substrate, as discussed above.

Also within the scope of the instant invention is a dielectric substrate, preferably a glass substrate, having fired thereon one of the aluminum-silicon-glass compositions of the present invention. This conductive cermet has electroless plated thereon a nickel strike of about 0.05 to about 0.5, preferably about 0.1, mil thick. This nickel strike, electroless plated cermet is especially desirable for use as a cathode discharge surface. The particular electroless nickel plating process used is not critical and any of the various electroless nickel plating processes known to those skilled in the art can be used.

The advance involved in the gas discharge display devices of the present invention is in the use of the various compositions of the present invention as some or all of the electrodes. The geometry of the display device is not of the essence of the present invention. Any appropriate geometry can be used in manufacturing the display device. Display devices will comprise dielectric substrates having a cavity therebetween. The cavity is provided by a spacer between the substrates. The substrates and spacer are clamped or adhesively connected together. The substrates have electrodes of the present invention fired (sintered) thereon, the compositions of the present invention having been deposited (e.g., printed) thereon in a desired pattern, followed by heating to produce physically and electrically continuous conductors. The device can include printed dielectric layers, as well known in the art. The device will include means for evacuating the cavity and then filling with the appropriate excitable gas. The electrodes are, of course, operatively connected electrically with the desired electrical circuits.

The following examples are provided for the purpose of further illustration only and are not intended to be limitations on the disclosed invention.

EXAMPLES 1-16

Silicon metal powder and glass frit were reduced in size to −400 mesh (U.S. Standard Sieve Scale) by ball milling. These materials were then weighed out in the proper proportions with −400 mesh aluminum powder (containing a maximum of 0.15% silicon as impurities) and dry mixed by being placed in a sealed glass jar which was subsequently rolled for several hours. (Note: This specification and its appended claims assume that the aluminum can contain up to 0.15% silicon. Aluminum containing more than 0.15% silicon can also be used in this invention but in such case the amount of silicon present over 0.15% has been calculated as part of the silicon moiety of the compositions of this invention as expressed in the specification and claims). This mixture was then blended with an appropriate organic binder to form a thick film paste.

The thick film pastes were printed through a patterned 325 mesh screen on soda lime glass substrates as a 56 square serpentine pattern. The prints were dried at 100° C. for 15 minutes to a dried thickness of about 20-25 microns then fired in air in a belt type tunnel kiln at the respective temperatures indicated in Tables I and II for 15 minutes at peak temperatures. Fired film thickness was about 20 microns.

TABLE I

| Ex. No. | Si (%) | Glass (%) | Al (%) | Sheet Resistivity (ohms/square) at Respective Firing Temperature (°C.) | | | | |
|---|---|---|---|---|---|---|---|---|
| | | | | 605 | 615 | 625 | 635 | 645 |
| 1 | 0.25 | 30 | 69.75 | 0.54 | 0.29 | 0.027 | 0.022 | 0.018 |
| 2 | 0.50 | 30 | 69.50 | 0.107 | 0.134 | 0.013 | 0.013 | 0.011 |
| 3 | 0.75 | 30 | 69.25 | 0.036 | 0.030 | 0.009 | 0.012 | 0.013 |
| 4 | 1.0 | 30 | 69.00 | 0.020 | 0.020 | 0.013 | 0.012 | 0.009 |
| 5 | 1.25 | 30 | 68.75 | 0.018 | 0.018 | 0.013 | 0.013 | 0.012 |

TABLE I-continued

| Ex. No. | Si (%) | Glass (%) | Al (%) | Sheet Resistivity (ohms/square) at Respective Firing Temperature (°C.) | | | | |
|---|---|---|---|---|---|---|---|---|
| | | | | 605 | 615 | 625 | 635 | 645 |
| 6 | 1.50 | 30 | 68.50 | 0.012 | 0.012 | 0.011 | 0.011 | 0.009 |

TABLE II

| Ex. No. | Si (%) | Glass (%) | Al (%) | Sheet Resistivity (ohms/square) at Respective Firing Temperatures (°C.) | | | | |
|---|---|---|---|---|---|---|---|---|
| | | | | 585 | 595 | 605 | 615 | 625 |
| 7 | 10 | 20 | 70 | .052 | 0.028 | 0.026 | 0.027 | 0.032 |
| 8 | 20 | 20 | 60 | .094 | 0.04 | 0.036 | 0.036 | 0.040 |
| 9 | 30 | 20 | 30 | 0.18 | 0.07 | 0.063 | 0.070 | 0.066 |
| 10 | 10 | 30 | 60 | 0.18 | 0.034 | 0.027 | 0.025 | 0.030 |
| 11 | 20 | 30 | 50 | 0.040 | 0.056 | 0.043 | 0.042 | 0.048 |
| 12 | 30 | 30 | 40 | 1.7 | 0.17 | 0.12 | 0.12 | 0.14 |
| 13 | 10 | 40 | 50 | 3.6 | 0.055 | 0.038 | 0.036 | 0.036 |
| 14 | 20 | 40 | 40 | 4.5 | 0.128 | 0.09 | 0.075 | 0.075 |
| 15 | 30 | 40 | 30 | 5.1 | 0.54 | 0.32 | 0.28 | 0.32 |
| 16 | 7.5 | 50 | 42.5 | 1000 | 0.18 | 0.18 | 0.06 | 0.07 |

Table I sets forth weight percentages of materials, peak firing temperatures, and sheet resistivity of the fired samples. The materials used in examples 1–6 can be successfully refired without objectional droplet formation.

When refiring is not required above 580° C., examples 7–16 shown in Table II produce conductors on glass substrates with excellent adhesion and moisture resistance in addition to improved scratch resistance.

EXAMPLE 17

Glass frit was reduced in size to −400 mesh (U.S. Standard Sieve Scale) by ball milling. This material was then weighed out in the proper proportion with −400 mesh aluminum powder (containing a maximum of 0.15% silicon as impurities) and dry mixed by being placed in a sealed glass jar which was subsequently rolled for several hours. This mixture was then blended with an appropriate organic binder to form a thick film paste.

The thick film paste was printed, dried, and fired as described in examples 1–16. Table III depicts the firing temperatures and sheet resistivity of this aluminum-glass conductive composition.

TABLE III

| Ex. No. | Si (%) | Glass (%) | Al (%) | Sheet Resistivity (ohms/square) at Respective Firing Temperature (°C.) | | | |
|---|---|---|---|---|---|---|---|
| | | | | 605 | 615 | 625 | 635 |
| 17 | 0 | 30 | 70 | 2.2 | 0.45 | 0.20 | 0.11 |

A comparison of Table III with Tables I and II evidences two unobvious facts. The first is that at the same firing temperature, the aluminum-silicon-glass conductive composition, with one exception, possessed a resistivity lower than the aluminum-glass conductive composition. This phenomenon is completely unexpected in view of the fact that, as those skilled in the art know, alloys customarily possess a resistivity at least greater than the resistivity of the more conductive component and often greater than the resistivity of the less conductive component as well.

The second unobvious fact is that the firing window is unexpectedly enlarged by the addition of silicon to an aluminum based conductor composition.

Based on this disclosure, many other modifications and ramifications will naturally suggest themselves to those skilled in the art. These are intended to be comprehended as within the scope of this invention.

The embodiments of the invention in which an exclusive property or priviledge is claimed are defined as follows:

1. An electroconductive material comprising from about 0.25 to about 30 weight percent silicon, from about 10 to about 50 weight percent glass having a softening point below 660° C., and from about 20 to about 90 weight percent aluminum wherein said material has a lower resistivity than an aluminum-glass electroconductive material formed from a composition having the same glass and binder content as employed in the composition from which the silicon-aluminum-glass electroconductive material is formed.

2. The material of claim 1 comprising from about 0.25 to about 1.5 weight percent silicon, from about 25 to about 35 weight percent of said glass, and from about 75 to about 87 weight percent aluminum.

3. The material of claim 1 comprising from about 7 to about 11 weight percent silicon, from about 35 to about 45 weight percent of said glass, and from about 35 to about 58 weight percent aluminum.

4. The material of claim 1 comprising 10 percent silicon, 40 percent of said glass, and 50 percent aluminum.

5. The material of claim 1 wherein said glass is a high lead glass.

* * * * *